(12) United States Patent
Take et al.

(10) Patent No.: US 8,411,433 B2
(45) Date of Patent: Apr. 2, 2013

(54) FLAT PANEL DISPLAY DEVICE

(75) Inventors: Nobuyuki Take, Higashioska (JP);
Tsuyoshi Okumura, Higashioska (JP);
Naotaka Namioka, Daito (JP)

(73) Assignee: SANYO Electric Co., Ltd.,
Moriguch-shi, Osaka (JP)

( * ) Notice: Subject to any disclaimer, the term of this patent is extended or adjusted under 35 U.S.C. 154(b) by 168 days.

(21) Appl. No.: 13/035,189

(22) Filed: Feb. 25, 2011

(65) Prior Publication Data

US 2011/0211302 A1    Sep. 1, 2011

(30) Foreign Application Priority Data

Feb. 26, 2010  (JP) .................................. 2010-041843

(51) Int. Cl.
*G06F 1/16*    (2006.01)
(52) U.S. Cl. ........... 361/679.59; 361/679.21; 361/679.6; 312/223.1; 312/223.2; 248/917; 248/918
(58) Field of Classification Search ............... 361/679.59
See application file for complete search history.

(56) References Cited

U.S. PATENT DOCUMENTS

| | | | |
|---|---|---|---|
| D339,574 S * | 9/1993 | Althans et al. | D14/374 |
| 7,651,062 B2 * | 1/2010 | Matsutani et al. | 248/176.3 |
| 7,667,955 B2 * | 2/2010 | Takeda | 361/679.21 |
| 8,196,880 B2 * | 6/2012 | Fujikawa et al. | 248/188.1 |
| 2006/0198097 A1 * | 9/2006 | Kuwajima et al. | 361/685 |
| 2009/0140963 A1 * | 6/2009 | Okumura et al. | 345/87 |

FOREIGN PATENT DOCUMENTS

JP    2007-310186 A    11/2007

* cited by examiner

*Primary Examiner* — Anthony Q Edwards
(74) *Attorney, Agent, or Firm* — Westerman, Hattori, Daniels & Adrian, LLP

(57) ABSTRACT

In a flat panel display device according to the present invention, a stand is made up of a base part and a supporting column part erected on the base part, and the stand is fastened to a device main body in a state where a front surface of the supporting column part of the stand opposes a rear surface of the device main body. An approximately horizontal receiving surface for receiving a bottom surface of the device main body is formed more forward than the front surface on the supporting column part of the stand.

1 Claim, 7 Drawing Sheets

# FLAT PANEL DISPLAY DEVICE

This application claims priority to Japanese Patent Application No. 2010-41843, the contents of which are hereby incorporated by reference into the present application.

BACKGROUND OF THE INVENTION

1. Field of the Invention

The present invention relates to a flat panel display device such as a liquid crystal television receiver, and particularly, to a flat panel display device including a stand that enables a device main body to be self-standing.

2. Description of the Related Art

Conventionally, with flat panel display devices such as a liquid crystal television receiver, a stand is detachably mounted to a device main body and the device main body is installed in a self-standing state.

For example, in a liquid crystal television receiver illustrated in FIG. 7, a liquid crystal display panel 4 is disposed between a front cabinet 61 and a back cabinet 62 constituting a device main body 6, and a stand 5 is mounted to a bottom of the device main body 6. The stand 5 is made up of a base part 51 and a supporting column part 52 erected on the base part 51.

The stand 5 causes a front surface of the supporting column part 52 to abut a rear surface 63 of the back cabinet 62 of the device main body 6, and is fastened to the device main body 6 by a plurality of screws 7 in a state where a bottom surface 64 of the back cabinet 62 is received by a receiving surface 53 of the supporting column part 52.

Meanwhile, in the liquid crystal television receiver illustrated in FIG. 7, since the liquid crystal display panel 4 built into the device main body 6 makes up a majority of the weight of the device main body 6, the liquid crystal display panel 4 determines a position of center of gravity G of the device main body 6, and since the position of center of gravity G is positioned more forward than the receiving surface 53 of the supporting column part 52 of the stand 5, a moment M is generated in a direction that causes the device main body 6 to fall forward around the receiving surface 53 of the stand 5. Therefore, the stand 5 is formed in a shape in which the base part 51 protrudes significantly forward so as to prevent the device main body 6 from overturning.

However, when a plastic stand 5 is adopted by a conventional liquid crystal television receiver, a rise in temperature causes the stand 5 to soften and the strength of the stand 5 to deteriorate. As a result, deformation of the base part 51 of the stand 5 occurs, creating a risk that the device main body 6 may fall forward.

SUMMARY OF THE INVENTION

A flat panel display device according to the present invention includes a device main body 1 with a built-in flat-screen display panel, and a stand 2 which is mounted to a bottom of the device main body 1 and which enables the device main body 1 to be self-standing, wherein the stand 2 is made up of a base part 21 and a supporting column part 22 erected on the base part 21, and the stand 2 is fastened to the device main body 1 in a state where a front surface 23 of the supporting column part 22 of the stand 2 opposes a rear surface 13 of the device main body 1. A receiving surface 24 for receiving a bottom surface 15 of the device main body 1 is formed more forward than the front surface 23 on the supporting column part 22 of the stand 2.

DETAILED DESCRIPTION OF THE PREFERRED EMBODIMENT

Hereinafter, an embodiment of the present invention implemented on a liquid crystal television receiver will be concretely described with reference to the drawings. In the following description, it is to be understood that frontward refers to a direction in which a screen 41 is formed as seen from a central position of a device main body 1 illustrated in FIG. 3 (a leftward direction in FIG. 3).

Figure 1:
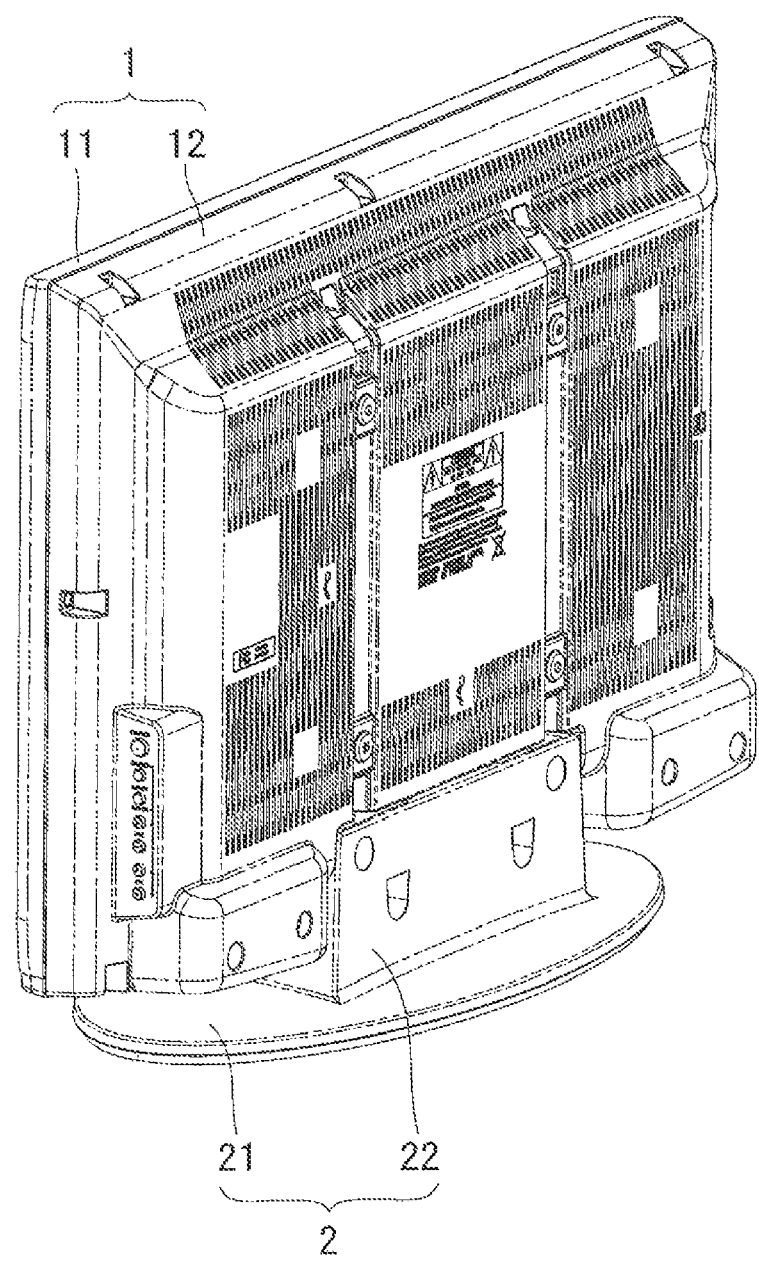
FIG. 1 is a perspective view illustrating a rear surface side of a liquid crystal television receiver that is an embodiment of the present invention.
Figure 2:
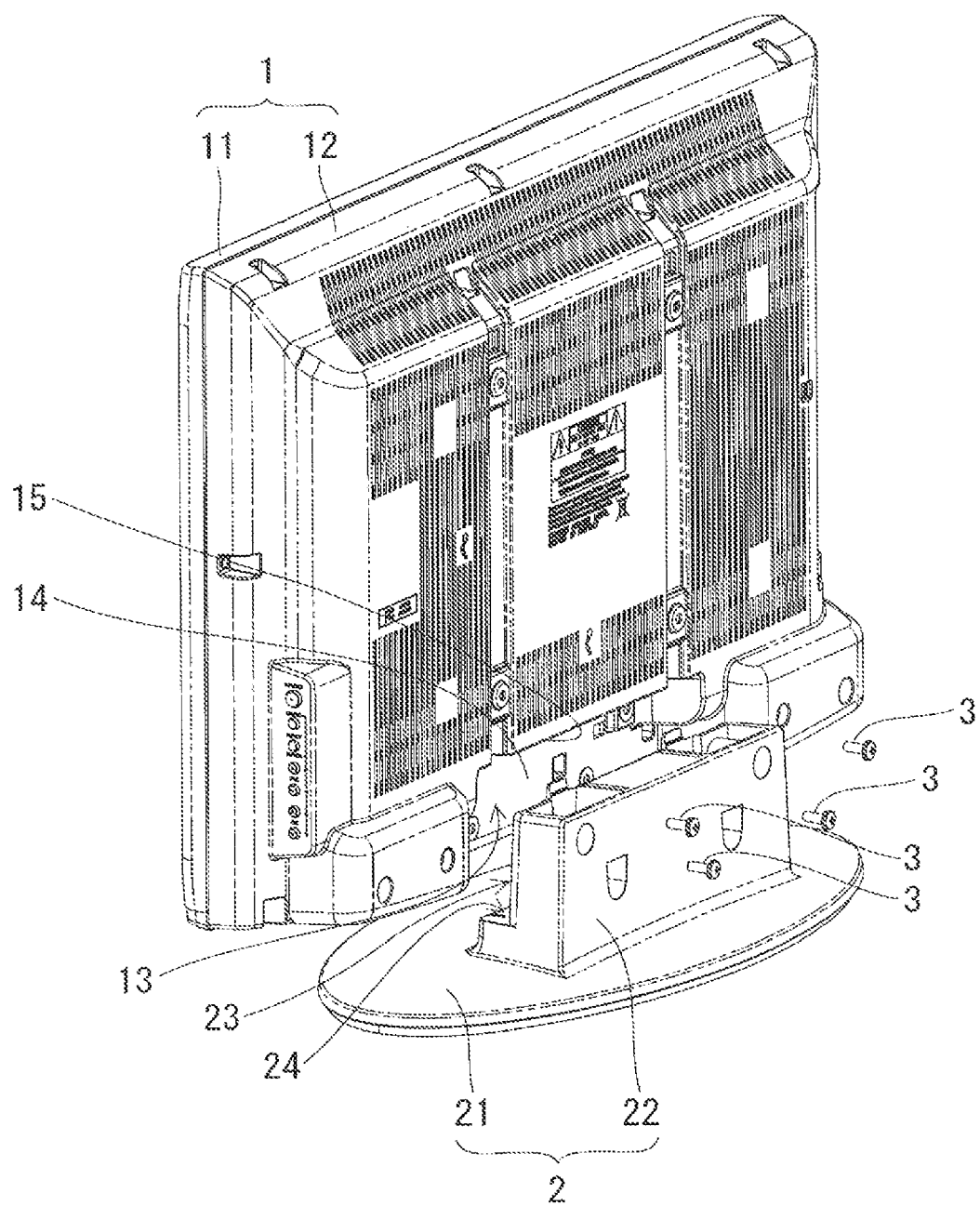
FIG. 2 is a perspective view illustrating a state where a stand is detached from a device main body in the liquid crystal television receiver.

As illustrated in FIGS. 1 and 2, the liquid crystal television receiver that is an embodiment of the present invention is made up of a device main body 1 and a plastic stand 2, and becomes self-standing in a state where the stand 2 is mounted to a bottom of the device main body 1.

The device main body 1 includes a front cabinet 11 and a back cabinet 12, and the stand 2 constitutes a supporting column part 22 erected on a base part 21.

Figure 3:
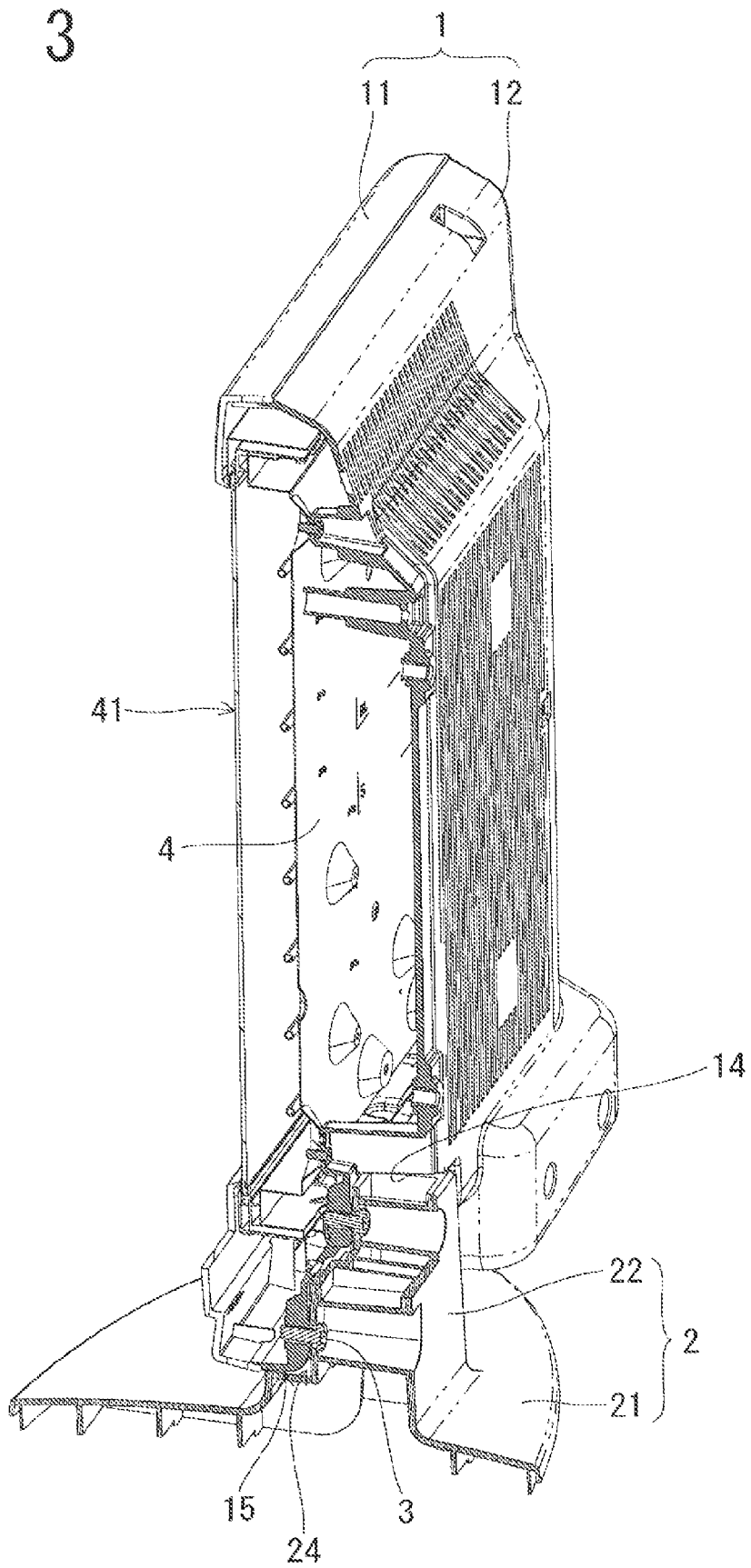
FIG. 3 is a partially cutaway perspective view of the liquid crystal television receiver.

As illustrated in FIG. 3, a liquid crystal display panel 4 having a screen 41 is disposed between the front cabinet 11 and the back cabinet 12.

Figure 5:
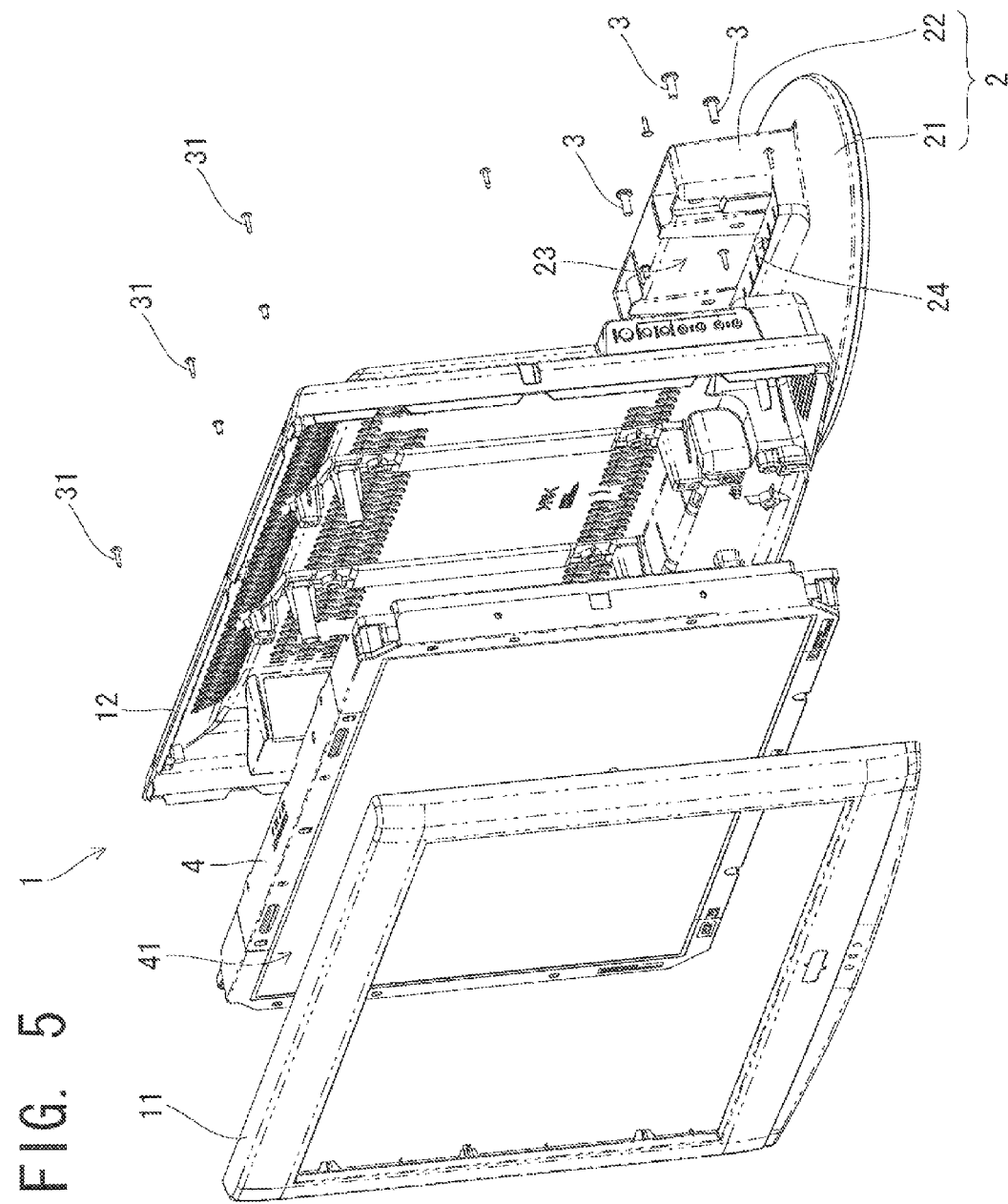
FIG. 5 is an exploded perspective view of the liquid crystal television receiver as seen from a front surface side.
Figure 6:
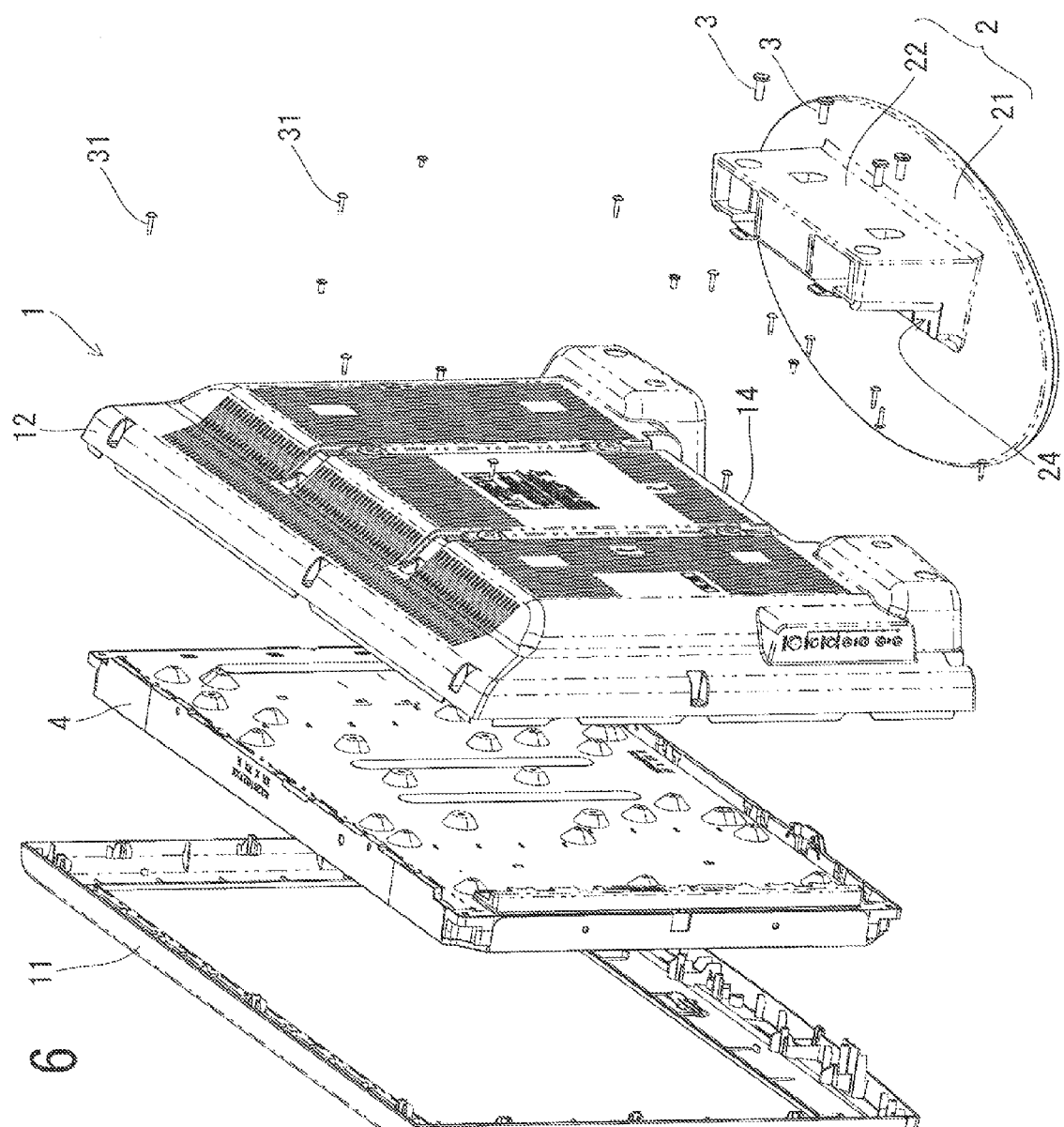
FIG. 6 is an exploded perspective view of the liquid crystal television receiver as seen from a rear surface side.
Figure 7:
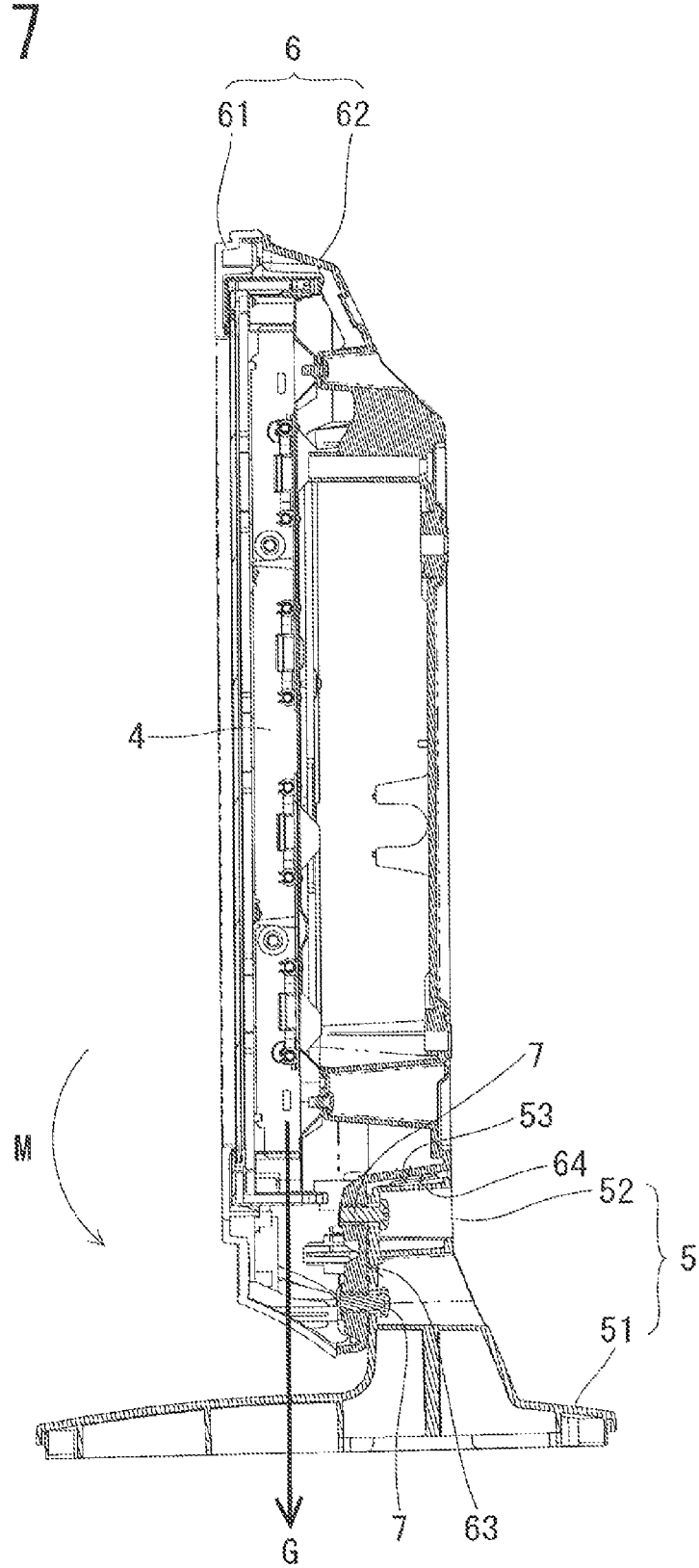
FIG. 7 is a cross-sectional view of a conventional liquid crystal television receiver.

As illustrated in FIGS. 5 and 6, the front cabinet 11 and the back cabinet 12 are coupled to each other using a plurality of screws 31.

As illustrated in FIG. 2, a depressed portion 14 that opens downward and rearward is formed at a bottom of the back cabinet 12 of the device main body 1. The stand 2 is fastened to the back cabinet 12 using a plurality of screws 3 in a state where the supporting column part 22 of the stand 2 engages the depressed portion 14 and a front surface 23 of the supporting column part 22 of the stand 2 opposes a rear surface 13 of the back cabinet 12.

Figure 4:
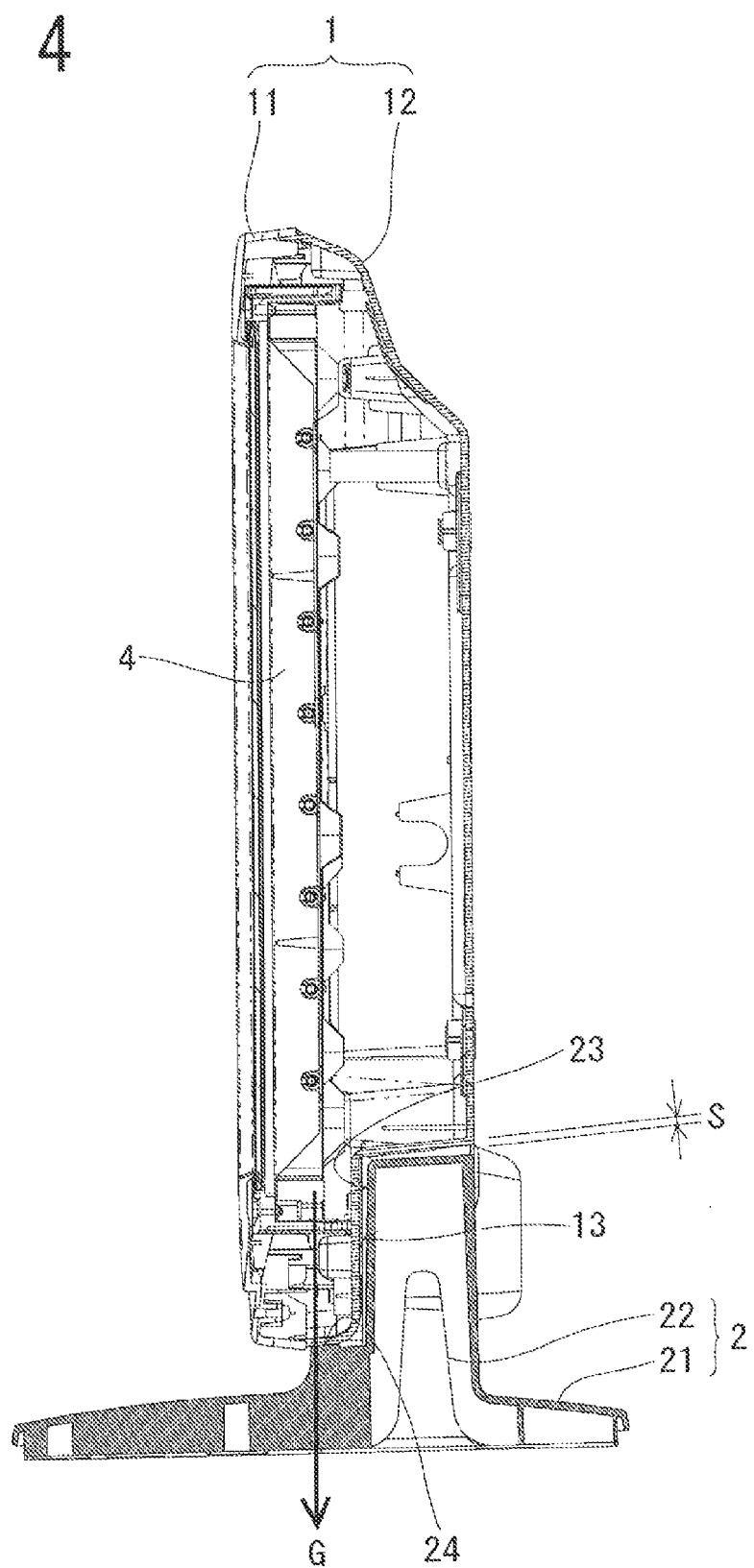
FIG. 4 is a cross-sectional view of the liquid crystal television receiver.

As illustrated in FIG. 4, a receiving surface 24 that extends approximately horizontally forward from a lower end of the front surface 23 is formed on the supporting column part 22 of the stand 2, and as illustrated in FIG. 3, a bottom surface 15 of the device main body 1 is received by the receiving surface 24 of the stand 2. Moreover, as illustrated in FIG. 4, the receiving surface 24 of the stand 2 is provided at a position that intersects a vertical line drawn through a center of gravity G of the device main body 1.

In this state, a slight gap S is provided between an upper surface of the supporting column part 22 of the stand 2 and a ceiling surface of the depressed portion 14 of the device main body 1 as illustrated in FIG. 4. Accordingly, the receiving surface 24 of the stand 2 and the bottom surface 15 of the device main body 1 reliably abut each other.

In the liquid crystal television receiver described above, since the receiving surface 24 of the stand 2 is more forward than the front surface 23 of the stand 2 and is provided at a position that intersects a vertical line drawn through the center of gravity G of the device main body 1, a moment in a direction that causes the device main body 1 to fall forward around a position of the receiving surface 53 of the stand 2 becomes approximately zero.

Therefore, even if the stand 2 softens due to a rise in temperature and deterioration in strength occurs, the device main body 1 is securely supported by the stand 2 and overturning of the device main body 1 can be prevented. In addition, the strength of the stand 2 itself can be held lower than before and, as a result, cost reduction can be achieved.

Moreover, the respective components of the present invention is not limited to the embodiment described above, and various modifications will occur to those skilled in the art without departing from the spirit and scope of the present invention as set out in the claims. For example, the stand 2 is not limited to a plastic stand and may be a metal stand or the like. In this case, a structure of the stand 2 for withstanding a moment generated by the weight of the liquid crystal display panel 4 can be simplified.

Furthermore, in addition to a liquid crystal television receiver, the present invention can be implemented on various flat panel display devices.

What is claimed is:

1. A flat panel display device comprising:
    a device main body with a built-in flat-screen display panel; and
    a stand which is mounted at a bottom of the device main body and which enables the device main body to be self-standing,
    wherein the stand is made up of a base part and a supporting column part erected on the base part, the stand is fastened to the device main body in a state where a front surface of the supporting column part of the stand opposes a rear surface of the device main body, and a receiving surface for receiving a bottom surface of the device main body is formed more forward than the front surface on the supporting column part of the stand,
    wherein a depressed portion which is engaged by the supporting column part of the stand is formed on the device main body, and the receiving surface of the stand is positioned more forward than the depressed portion of the device main body in a state where the supporting column part of the stand engages the depressed portion of the device main body, and
    wherein the receiving surface of the stand is provided at a position that intersects a vertical line drawn through a center of gravity of the device main body.

* * * * *